United States Patent
Khandros et al.

(10) Patent No.: US 7,345,493 B2
(45) Date of Patent: Mar. 18, 2008

(54) WAFER-LEVEL BURN-IN AND TEST

(75) Inventors: Igor Y. Khandros, Orinda, CA (US); David V. Pedersen, Scotts Valley, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/458,375

(22) Filed: Jul. 18, 2006

(65) Prior Publication Data

US 2007/0013401 A1   Jan. 18, 2007

Related U.S. Application Data

(63) Continuation of application No. 10/924,141, filed on Aug. 23, 2004, now Pat. No. 7,078,926, which is a continuation of application No. 10/326,423, filed on Dec. 19, 2002, now Pat. No. 6,788,094, which is a continuation of application No. 09/573,489, filed on May 16, 2000, now Pat. No. 6,525,555, which is a continuation of application No. 08/784,862, filed on Jan. 15, 1997, now Pat. No. 6,064,213, which is a continuation-in-part of application No. 08/452,255, filed on May 26, 1995, now Pat. No. 6,336,269, which is a continuation-in-part of application No. 08/340,144, filed on Nov. 15, 1994, now Pat. No. 5,917,707, which is a continuation-in-part of application No. 08/152,812, filed on Nov. 16, 1993, now Pat. No. 5,476,211, said application No. 08/784,862 is a continuation-in-part of application No. 08/526,246, filed on Sep. 21, 1995, now abandoned, which is a continuation-in-part of application No. 08/452,255, filed on May 26, 1995, now Pat. No. 6,336,269, said application No. 08/784,862 is a continuation-in-part of application No. 08/533,584, filed on Oct. 18, 1995, now Pat. No. 5,772,451, which is a continuation-in-part of application No. 08/452,255, filed on May 26, 1995, now Pat. No. 6,336,269, said application No. 08/784,862 is a continuation-in-part of application No. 08/554,902, filed on Nov. 9, 1995, now Pat. No. 5,974,662, which is a continuation-in-part of application No. 08/452,255, filed on May 26, 1995, now Pat. No. 6,336,269, said application No. 08/784,862 is a continuation-in-part of application No. 08/558,332, filed on Nov. 15, 1995, now Pat. No. 5,829,128, which is a continuation-in-part of application No. 08/452,255, filed on May 26, 1995, now Pat. No. 6,336,269, said application No. 08/784,862 is a continuation-in-part of application No. 08/573,945, filed on Dec. 18, 1995, now Pat. No. 5,601,740, which is a continuation-in-part of application No. 08/452,255, filed on May 26, 1995, now Pat. No. 6,336,269, said application No. 08/784,862 is a continuation-in-part of application No. 08/602,179, filed on Feb. 15, 1996, now abandoned, which is a continuation-in-part of application No. 08/452,255, filed on May 26, 1995, now Pat. No. 6,336,269.

(60) Provisional application No. 60/032,666, filed on Dec. 13, 1996, provisional application No. 60/030,697, filed on Nov. 13, 1996, provisional application No. 60/005,189, filed on May 17, 1996, provisional application No. 60/013,247, filed on Mar. 11, 1996, provisional application No. 60/012,878, filed on Mar. 5, 1996, provisional application No. 60/012,040, filed on Feb. 22, 1996, provisional application No. 60/012,027, filed on Feb. 21, 1996.

(51) Int. Cl.
*G01R 31/02* (2006.01)
(52) U.S. Cl. .................................................. 324/754
(58) Field of Classification Search ................ None
See application file for complete search history.

(56) References Cited

U.S. PATENT DOCUMENTS

| | | |
|---|---|---|
| 3,781,683 A | 12/1973 | Freed |
| 3,827,820 A | 8/1974 | Hoffman |
| 4,038,599 A | 7/1977 | Bove et al. |
| 4,455,654 A | 6/1984 | Bhaskar et al. |
| 4,468,616 A | 8/1984 | Yoshizaki |

| | | |
|---|---|---|
| 4,523,144 A | 6/1985 | Okubo et al. |
| 4,706,018 A | 11/1987 | Beha et al. |
| 4,780,670 A | 10/1988 | Cherry |
| 4,837,622 A | 6/1989 | Whann et al. |
| 4,899,099 A | 2/1990 | Mendenhall |
| 5,070,297 A | 12/1991 | Kwon |
| 5,090,118 A | 2/1992 | Kwon et al. |
| 5,103,557 A | 4/1992 | Leedy |
| 5,148,103 A | 9/1992 | Pasiecznik, Jr. |
| 5,162,728 A | 11/1992 | Huppenthal |
| 5,172,050 A | 12/1992 | Swapp |
| 5,187,020 A | 2/1993 | Kwon et al. |
| 5,191,708 A | 3/1993 | Kasukabe et al. |
| 5,243,274 A | 9/1993 | Kelsey et al. |
| 5,261,155 A | 11/1993 | Angulas et al. |
| 5,323,107 A | 6/1994 | D'Souza |
| 5,357,523 A | 10/1994 | Bogholtz, Jr. et al. |
| 5,363,038 A | 11/1994 | Love |
| 5,367,254 A | 11/1994 | Faure et al. |
| 5,389,556 A | 2/1995 | Rostoker et al. |
| 5,406,210 A | 4/1995 | Pedder |
| 5,422,574 A | 6/1995 | Kister |
| 5,434,513 A | 7/1995 | Fujii et al. |
| 5,442,282 A | 8/1995 | Rostoker et al. |
| 5,476,211 A | 12/1995 | Khandros |
| 5,479,105 A | 12/1995 | Kim et al. |
| 5,491,426 A | 2/1996 | Small |
| 5,495,667 A | 3/1996 | Farnworth et al. |
| 5,497,079 A | 3/1996 | Yamada et al. |
| 5,532,610 A | 7/1996 | Tsujide et al. |
| 5,534,784 A | 7/1996 | Lum et al. |
| 5,568,054 A | 10/1996 | Iino et al. |
| 5,570,032 A | 10/1996 | Atkines et al. |
| 5,600,257 A | 2/1997 | Leas et al. |
| 5,625,297 A | 4/1997 | Arnaudov et al. |
| 5,642,054 A | 6/1997 | Pasiecznik, Jr. |
| 5,648,661 A | 7/1997 | Rostoker et al. |
| 5,669,774 A | 9/1997 | Grabbe |
| 5,670,889 A | 9/1997 | Okubo et al. |
| 5,686,842 A | 11/1997 | Lee |
| 5,701,085 A | 12/1997 | Malladi et al. |
| 5,701,666 A | 12/1997 | DeHaven et al. |
| 5,736,850 A | 4/1998 | Legal |
| 5,764,072 A | 6/1998 | Kister |
| 5,772,451 A | 6/1998 | Dozier, II et al. |
| 5,806,181 A | 9/1998 | Khandros et al. |
| 5,821,763 A | 10/1998 | Beaman et al. |
| 5,829,128 A | 11/1998 | Eldridge et al. |
| 5,832,601 A | 11/1998 | Eldridge et al. |
| 5,834,946 A | 11/1998 | Albrow et al. |
| 5,838,163 A | 11/1998 | Rostoker et al. |
| 5,864,946 A | 2/1999 | Eldridge et al. |
| 5,878,486 A | 3/1999 | Eldridge et al. |
| 5,884,398 A | 3/1999 | Eldridge et al. |
| 5,897,326 A | 4/1999 | Eldridge et al. |
| 5,900,738 A | 5/1999 | Khandros et al. |
| 5,917,707 A | 6/1999 | Khandros et al. |
| 5,974,662 A | 11/1999 | Eldridge et al. |
| 5,983,493 A | 11/1999 | Eldridge et al. |
| 5,998,228 A | 12/1999 | Eldridge et al. |
| 6,029,344 A | 2/2000 | Khandros et al. |
| 6,032,356 A | 3/2000 | Eldridge et al. |
| 6,059,982 A | 5/2000 | Palagonia et al. |
| 6,064,213 A | 5/2000 | Khandros et al. |
| 6,110,823 A | 8/2000 | Eldridge et al. |
| 6,133,744 A | 10/2000 | Yojima et al. |
| 6,174,744 B1 | 1/2001 | Watanabe et al. |
| 6,219,908 B1 | 4/2001 | Farnworth et al. |
| 6,316,988 B1 | 11/2001 | Forehand et al. |
| 6,525,555 B1 | 2/2003 | Khandros et al. |
| 6,535,555 B1 | 3/2003 | Bordes et al. |
| 6,655,023 B1 | 12/2003 | Eldridge et al. |
| 6,788,094 B2 | 9/2004 | Khandros et al. |
| 6,812,718 B1 * | 11/2004 | Chong et al. ............... 324/754 |
| 7,009,412 B2 * | 3/2006 | Chong et al. ............... 324/754 |
| 7,078,926 B2 | 7/2006 | Khandros et al. |
| 7,138,818 B2 * | 11/2006 | Chong et al. ............... 324/764 |
| 7,245,137 B2 * | 7/2007 | Eldridge et al. ............ 324/755 |
| 2003/0107394 A1 | 6/2003 | Khandros et al. |
| 2004/0068869 A1 | 4/2004 | Eldridge et al. |

FOREIGN PATENT DOCUMENTS

| | | |
|---|---|---|
| DE | 9004562 | 8/1990 |
| EP | 047141 | 3/1982 |
| EP | 699912 | 3/1996 |
| EP | 708338 | 4/1996 |
| FR | 2645679 | 10/1990 |
| JP | 02-15985 | 6/1990 |
| JP | 06-180342 | 6/1994 |
| JP | 07-111283 | 4/1995 |
| JP | 08-37215 | 2/1996 |
| JP | 08-50162 | 2/1996 |
| JP | 08/129053 | 5/1996 |
| JP | 08-184612 | 7/1996 |
| JP | 10-510682 | 10/1998 |
| WO | WO 91/12706 | 8/1991 |
| WO | WO 95/14314 | 5/1995 |
| WO | WO 96/08056 | 3/1996 |
| WO | WO 96/15459 | 5/1996 |
| WO | WO 98/01906 | 1/1998 |

* cited by examiner

*Primary Examiner*—Jermele Hollington
(74) *Attorney, Agent, or Firm*—N. Kenneth Burraston

(57) ABSTRACT

Techniques for performing wafer-level burn-in and test of semiconductor devices include a test substrate having active electronic components such as ASICs mounted to an interconnection substrate or incorporated therein, metallic spring contact elements effecting interconnections between the ASICs and a plurality of devices-under-test (DUTs) on a wafer-under-test (WUT), all disposed in a vacuum vessel so that the ASICs can be operated at temperatures independent from and significantly lower than the burn-in temperature of the DUTs. The spring contact elements may be mounted to either the DUTs or to the ASICs, and may fan out to relax tolerance constraints on aligning and interconnecting the ASICs and the DUTs. Physical alignment techniques are also described.

8 Claims, 6 Drawing Sheets

WAFER-LEVEL BURN-IN AND TEST

CROSS-REFERENCE TO RELATED APPLICATIONS

This patent application is a continuation of U.S. patent application Ser. No. 10/924,141, filed Aug. 23, 2004 (now U.S. Pat. No. 7,078,926), which is a continuation of U.S. patent application Ser. No. 10/326,423, filed Dec. 19, 2002 (now U.S. Pat. No. 6,788,094), which is a continuation of U.S. patent application Ser. No. 09/573,489, filed May 16, 2000 (now U.S. Pat. No. 6,525,555), which is a continuation of U.S. patent application Ser. No. 08/784,862, filed Jan. 15, 1997 (now U.S. Pat. No. 6,064,213), which is a continuation-in-part of commonly-owned, U.S. patent application Ser. No. 08/452,255, now U.S. Pat. No. 6,336,269, (hereinafter "PARENT CASE") filed 26 May 1995 and its counterpart PCT patent application number US95/14909 filed 13 Nov. 95, both of which are continuations-in-part of commonly-owned, U.S. patent application Ser. No. 08/340,144 filed 15 Nov. 1994, now U.S. Pat. No. 5,917,707, and its counterpart PCT patent application number US94/13373 filed 16 Nov. 1994, both of which are continuations-in-part of commonly-owned, U.S. patent application Ser. No. 08/152,812 filed 16 Nov. 1993 (now U.S. Pat. No. 5,476,211, 19 Dec. 1995), all of which are incorporated by reference herein.

U.S. patent application Ser. No. 08/784,862, filed Jan. 15, 1997 (now U.S. Pat. No. 6,064,213) is also a continuation-in-part of the following commonly-owned, U.S. patent application Ser. Nos.:

08/526,246 filed 21 Sep. 1995, now abandoned, (PCT/US95/14843, 13 Nov. 1995);

08/533,584 filed 18 Oct. 1995, now U.S. Pat. No. 5,772,451, (PCT/US95/14842, 13 Nov. 1995);

08/554,902 filed 9 Nov. 1995, now U.S. Pat. No. 5,974,662, (PCT/US95/14844, 13 Nov. 1995);

08/558,332 filed 15 Nov. 1995, now U.S. Pat. No. 5,829,128, (PCT/US95/14885, 15 Nov. 1995);

08/573,945 filed 18 Dec. 1995, now U.S. Pat. No. 5,601,740, (PCT/US96/07924, 24 May 1996);

08/602,179 filed 15 Feb. 1996, now abandoned, (PCT/US96/08328, 28 May 1996);

60/012,027 filed 21 Feb. 1996 (PCT/US96/08117, 24 May 1996);

60/012,040 filed 22 Feb. 1996 (PCT/US96/08275, 28 May 1996);

60/012,878 filed 5 Mar. 1996 (PCT/US96/08274, 28 May 1996);

60/013,247 filed 11 Mar. 1996 (PCT/US96/08276, 28 May 1996; and

60/005,189 filed 17 May 1996 (PCT/US96/08107, 24 May 1996), all of which (except for the provisional patent applications) are continuations-in-part of the aforementioned PARENT CASE, and all of which are incorporated by reference herein.

U.S. patent application Ser. No. 08/784,862, filed Jan. 15, 1997 (now U.S. Pat. No. 6,064,213) is also a continuation-in-part of the following commonly-owned, now abandoned U.S. Patent Application Nos.:

60/030,697 filed 13 Nov. 1996 by Khandros and Pedersen; and

60/032,666 filed 13 Dec. 1996 by Khandros and Pedersen.

TECHNICAL FIELD OF THE INVENTION

The present invention relates generally to exercising semiconductor devices and, more particularly, to performing test and burn-in on semiconductor devices to identify known good die (KGD) and, more specifically, to exercising semiconductor devices at wafer-level (prior to their being singulated, or "diced", from the wafer).

BACKGROUND OF THE INVENTION

Semiconductor devices, from microprocessors to memory chips, are fabricated by performing a long series of process steps such as etching, masking, depositing and the like on a silicon wafer. A typical silicon wafer is in the form of a six inch diameter disc, or larger. Many semiconductor devices, typically identical to one another, are fabricated on a single silicon wafer by placing them in a regular rectangular array. Kerf lines (scribe streets) are disposed between adjacent semiconductor devices on the wafer. Ultimately, the devices are singulated from the wafer by sawing along the scribe streets.

Due to defects in the wafer, or to defects in one or more of the processing steps, certain ones of the semiconductor devices will not function as designed, these defects may show up initially or may not be apparent until the device has been in operation for an extended period of time. Thus it is important to test and electrically exercise the devices for an extended period of time to ascertain which devices are good and which are not good.

Typically, semiconductor devices are exercised (burned-in and tested) only after they have been singulated (separated) from the wafer and have gone through another long series of "back-end" process steps in which they are assembled into their final "packaged" form.

From a "global" perspective, a typical "back-end" process flow of the prior art is as follows (commencing with wafer fab): Wafer Sort #1;
  Laser Repair;
  Wafer Sort #2;
  Wafer Saw;
  Package Assembly steps, such as die attach, wire bond, encapsulation, lead trim and form, lead plating;
  Electrical Test;
  Burn-In;
  Electrical Test; and
  Mark and Ship product.

Modern semiconductor devices often contain hundreds of terminals (i.e., "pads" such as power, ground, input/output, etc.) and modern semiconductor wafers often contain hundreds of semiconductor devices, resulting in each wafer having tens of thousands of pads, or test points, which need to be accessed in order to carry out testing and/or burn-in at wafer-level (i.e., testing all the dice at one time) prior to singulating the dice from the wafer. Precise alignment is also a non-trivial issue, when dealing with spacings (pitch) between adjacent pads as close as 4 mils. Nevertheless, performing testing and/or burn-in on semiconductor devices, prior to their being singulated from the wafer has been the object of prolonged endeavor.

U.S. Pat. No. 5,570,032 (Atkins, et al.; "Micron Patent"; October 1996) discloses wafer scale burn-in apparatus and process wherein a wafer (14) being burned-in is mated to a printed circuit board (13) which electrically contacts the pads on each die on the wafer using small conductive pillars (15) on the printed circuit board. Precise alignment of the entire wafer with the printed circuit board is required in order to permit testing all the dice on the wafer in parallel, eliminating the need to probe each die individually. The apparatus is fitted with heating elements and cooling channels to generate the necessary wafer temperatures for burn-in and testing. The method of utilization eliminates processing of defective dice beyond burn-in and test. FIG. 1 of the Micron Patent provides a general overview of the prior art processing steps in taking a wafer from fabrication to shipment. FIG. 8 of the Micron Patent provides a comparable overview of the processing steps in taking a wafer from fabrication to shipment when utilizing the disclosed method of wafer scale burn-in and testing. It is suggested in the Micron Patent that it is also possible to have a printed circuit board with reduced connections and controlling logic (microprocessors, multiplexers, etc.), and to have complete test electronics included in the printed circuit board (see column 5, lines 53-60).

U.S. Pat. No. 5,532,610 (Tsujide, et al.; "NEC Patent"; July, 1996) discloses apparatus for testing semiconductor wafer wherein there is a testing substrate, an active circuit disposed on the testing substrate for activating chips disposed on a wafer to be tested, and a plurality of pads disposed on a front surface of the testing substrate and positioned so that the pads are disposed in alignment with bonding pads of the chips disposed on the wafer when the testing substrate is overlaid on the wafer. The testing substrate (2) may be a wafer, made of the same material as the wafer (1) so be tested. On the testing substrate (wafer) 2, lead lines 7 extend from pads 4 and are connected to a power supply, a ground line 8, an I/O line 9, and a chip selecting line 10. FIG. 4 of the NEC PATENT illustrates a testing apparatus 16 made of a silicon wafer, the back surface of which has been etched to have apertures 21 of a quadrangular pyramid shape which can serve as alignment marks to thereby make it easy to register the testing substrate (16) with the wafer (17) to be tested.

U.S. Pat. No. 5,434,513 (Fujii, et al.; "Rohm Patent"; July, 1995) discloses semiconductor wafer testing apparatus using intermediate semiconductor wafer wherein bump electrodes are formed on the bottom surface of an intermediate semiconductor wafer employed as a test substrate, and pickup electrodes and control electrodes are formed on the top (opposite) surface of the test substrate. A switching circuit is formed in the intermediate semiconductor wafer, and serves to connect selected ones of the bump electrodes to the pickup electrodes in accordance with switching control signals provided from a tester via the control electrodes. The pickup electrodes and the control electrodes are connected to the tester via pogo pins.

U.S. Pat. No. 5,497,079 (Yamada, et al.; "Matsushita Patent"; March 1996) discloses semiconductor testing apparatus, semiconductor testing circuit chip, and probe card wherein a plurality of semiconductor testing chips (2) are mounted to a one side of a motherboard (4) and a like plurality of on item of semiconductor integrated circuit chips (1) to be tested are mounted to an opposite side of the motherboard (4). A computer (3) is provided for controlling the semiconductor testing chips (2). Since the major testing functions are incorporated into the testing circuit chips (2), the computer (3) for collecting the test results can be a low-price computer. FIGS. 5, 7 and 10 of the Matsushita Patent illustrates a representative semiconductor test circuit chip (2) having test pattern generating means, a driver for applying the test pattern to the devices being tested, data storing means, data judging means for judging whether stored output data indicates a failure or not, and means for transferring a judgment result to a work station. FIG. 12 of the Matsushita Patent illustrates the structure of a semiconductor testing apparatus used in a wafer test wherein a plurality of semiconductor testing chips (2) are mounted to a probe card (103), a plurality of probe needles (104) extending from the probe card (presumably from the opposite surface of the probe card), and a wafer (106) being tested. When a control signal is transmitted from the work station to the semiconductor testing circuit chips, the semiconductor testing chips start testing the semiconductor integrated circuits formed on the semiconductor wafer.

Generally, previous attempts at implementing schemes for wafer-level testing have involved providing a single test substrate with a plurality of contact elements for contacting corresponding pads on the wafer being tested. As mentioned hereinabove, this may require many tens of thousands of such contact elements and extremely complex interconnection substrates. As an example, an 8" wafer may contain 500 16 Mb DRAMs, each having 60 bond pads, for a total of 30,000 connections. There are 30,000 connections to the wafer under test (WUT), 30,000 additional connections to the intermediate substrate, 30,000 more connections to the test electronics, and an undetermined number of connections to the control electronics. Moreover, the fine pitch requirements of modern semiconductor devices require extremely high tolerances to be maintained when bringing the test substrate together with the wafer being tested.

SUMMARY OF THE INVENTION

An object of the present invention is to provide an improved technique for performing wafer level burn-in and test.

An object of the present invention is to reduce the cost of manufacturing semiconductors by enabling a series of wafer level processing steps that results in a finished device that has superior physical qualities and higher reliability levels than the prior art will allow.

According to the invention, semiconductor devices are exercised at wafer-level, prior to their being singulated from the silicon wafer upon which they are fabricated. As used herein, the term "exercise" includes, but is not limited to, performing burn-in and functional tests on semiconductor devices. A plurality of pressure connections are made between a plurality of unsingulated semiconductor devices under test (DUTs) on a wafer under test (WUT) and a test substrate using interconnection elements such as spring contact elements to effect pressure connections therebetween. The spring contact elements are preferably mounted by their bases directly to the WUT (i.e., to the DUTs on the WUT) so as to have free ends extending to a common plane above the surface of the WUT. The test substrate preferably has a coefficient of thermal expansion which is well-matched with that of the WUT. Alternatively, the spring contact elements are mounted to the test substrate.

According to an aspect of the invention, the spring contact elements are arranged on the WUT so as to fan out, or to have a greater pitch at their tips than at their bases. The spring contact elements are suitably composite interconnection elements such as have been described in the PARENT CASE.

In an embodiment of the invention, the test substrate comprises a relatively large interconnection substrate and a plurality of relatively small substrates mounted and connected to the interconnection substrate, each small substrate being smaller in size (area) than the size (area) of a one of the DUTs. The small substrates are disposed on the front (facing the WUT) surface of the interconnection (support)

substrate. It is also possible that one small substrate is bigger than an individual DUT and "mates" with two or more DUTs. The small substrates are suitably active semiconductor devices, such as application-specific integrated circuits (ASICs). The design of the ASIC is such that it enables the number of signals being provided to the test substrate from an outside source (e.g., a host controller) to be minimized.

In the case of spring contact elements mounted to the DUTs, the tips of the spring contact elements are preferably fanned-out so as to be at a greater spacing than their mounted bases, and the ASICs are provided with capture pads (terminals) which may be oversized so as to relax alignment tolerances. The tips of the spring contact elements may fan out, yet be disposed in an area which is still less than and within the area of the DUT to which they are mounted. The ASIC for exercising the DUT is of a size which corresponds to the area of the tips of the spring contact elements.

In an embodiment of the invention, the ASICs are provided with indentations on their front surface, each indentation receiving a tip of a corresponding spring contact element mounted to a DUT. These indentations may be formed directly in the surface of the ASIC, or may be provided by a layer disposed over the surface of the ASIC. After receiving the tips, the ASICs can be moved laterally, or rotated (in-plane), to engage the tips of the spring contact elements with sidewalls of the indentation features.

According to an aspect of the invention, means are provided for ensuring precise alignment of the plurality of ASICs to the interconnection (support) substrate, including indentations on the back surfaces of the ASICs and corresponding indentations on the front surface of the interconnection substrate, and spheres disposed between the ASICs and the interconnection substrate.

According to an aspect of the invention, the test substrate is maintained at a temperature which is lower than the temperature of the WUT. This enables the DUTs on the WUT to be raised to a higher temperature for purpose of accelerating their burn-in, without adversely impacting the life expectancy of the ASICs mounted to the interconnection substrate. With the coefficients of thermal expansion of the test substrate closely matching that of the WUT, this will result in an insignificant lesser amount of thermal expansion of the test substrate than the WUT. A significant temperature differential between the WUT and the test substrate is readily preserved by disposing the entire apparatus (WUT and test substrate) in a vacuum environment.

In use, the test substrate is placed into contact with the WUT at room temperature. The capture features (e.g., indentations) on the front surface of the ASICs hold the spring contact elements in place. The DUTs can then be powered up. The vacuum environment prevents heat from the powered up DUTs from heating up the ASICs, thereby permitting the ASICs to be operated at a much lower temperature than the burn-in temperature of the DUTs.

According to an aspect of the invention, signals for testing the DUTs are provided by an outside source (host controller) to the plurality of ASICs in a first format such as a serial stream of data over relatively few lines, and are converted to a second format such as a individual signals for the individual relatively many ones of the spring contact elements contacting the DUTs. Alternatively, at least a portion of the signals for testing the DUTs can be generated within the ASICs, rather than supplied by an external host controller.

According to an aspect of the invention, the ASICs can accumulate (monitor) test results from the DUTs, for subsequent transmission to the host controller. This information (test results) can be used to characterize each of the DUTs on an individual basis. Additionally, based on test results from the DUTs, the ASICs can terminate further testing and/or burn-in on a DUT that has failed a critical test.

In another embodiment of the invention the ASICs are fabricated directly on a silicon wafer, rather than being mounted thereto. Redundancy is provided so that defective ASICs or portions thereof can electrically be replaced with one another.

A benefit of the present invention is that the ASICs can inexpensively be made, each "type" of ASIC being specifically designed to accommodate (mate with) a specific type of DUT.

Conventional burn-in techniques involve placing DUTs in a convection oven to elevate their temperatures. In the context of the present invention, it would generally be undesirable to subject the ASICs to such repeated heat cycles. Rather, according to the invention, the DUT(s) and the ASICs are brought into contact with one another and the DUTs are powered-up to perform burn-in. This results in heat being generated by the DUTs, in most cases sufficient heat to satisfy the requirements of elevating the temperature of the DUTs without any additional heat source.

According to an aspect of the invention, the assembly of DUTs and test substrate (interconnection substrate plus ASICs mounted thereto) are placed in a vacuum environment, and the only heat to which the ASICs are subjected will be small amounts of heat conducted to the ASICs along the spring contact elements effecting the electrical connections between the ASICs and the DUTs. The DUT substrate and the test substrate are in contact with liquid cooled chucks whose fluid goes to different controllers. The DUT substrate is taken to a high temperature, typically higher than can be accommodated with packaged parts and the test substrate is maintained at or below room temperature allowing for greatly enhanced electrical operation of the tester.

An advantage of the invention is that the DUTs are in direct contact with the ASICS, and the interconnection substrate which supports the ASICs can be a very low-density wiring substrate receiving very few signals from a host controller, the ASICs themselves generating the bulk of the great many (e.g., 30,000) signals required to exercise a plurality of DUTs on a WUT.

An advantage of the invention is that DUT operation can be ascertained over a wide temperature range, from well below room temperature to the maximum temperature allowed by the semiconductor process, all without thermally stressing the ASICs.

The present invention provides the enabling technology for a full wafer-level assembly process.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. Although the invention will be described in the context of these preferred embodiments, it should be understood that it is not intended to limit the spirit and scope of the invention to these particular embodiments.

DETAILED DESCRIPTION OF THE INVENTION

Figure 1A:
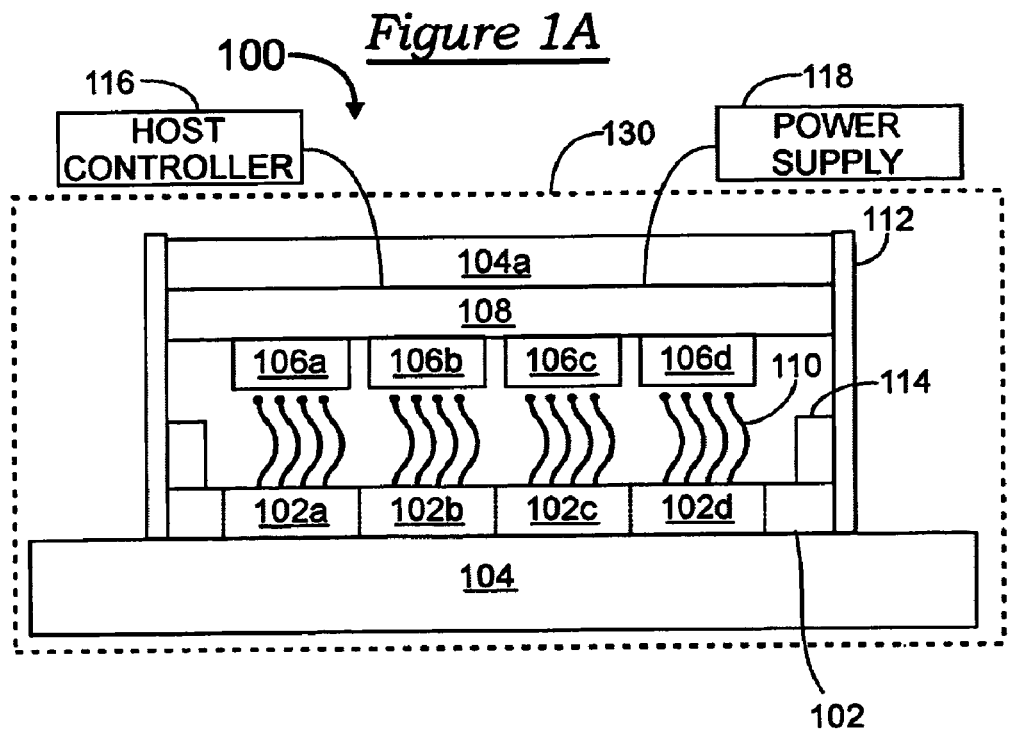
FIG. 1A is a side cross-sectional view of apparatus for performing a method of wafer-level burn-in and test, according to the invention.

FIG. 1A illustrates an apparatus 100 for performing a method of wafer-level burn-in and test, according to the invention. A wafer under test (WUT) 102 is disposed (received) on a suitable support, such as a temperature-controlled vacuum chuck 104, such that the semiconductor devices 102a, 102b, 102c, 102d formed on the WUT (the WUT is generally referred to herein as element 102) are facing up (as viewed).

A plurality (four of many shown) of relatively small active electronic components 106a, 106b, 106c and 106d, such as application-specific integrated circuits (ASICs; referred to generally as element 106) are mounted to a relatively large interconnection substrate (base plate) 108 which is generally of the same size (i.e., diameter) as the WUT 102. For example, the interconnection substrate 108 and the WUT 102 are both eight or twelve inches in diameter. Together, the electronic components (ASICs) 106 and the interconnection substrate 108 constitute a "test substrate".

The WUT 102 includes a plurality (four of many shown) of semiconductor devices 102a, 102b, 102c, 102d to be tested, or devices under test (DUTs).

A plurality (four of many shown) of spring contact elements 110 are mounted by their bases to the front (top, as viewed) surface of each DUT, and have tips extending to a common plane above the front surface of the DUT. These spring contact elements are suitably, but are not limited to, the free-standing, elongate, composite interconnect elements of the PARENT CASE.

In use, the test substrate (106, 108) and the WUT 102 are brought together (towards one another) in a predetermined alignment, until the tips of the spring contact elements 110 have made pressure-contact electrical connections to corresponding terminals (capture pads) 120 (see FIG. 1D) on the front surfaces of the ASICs 106. Guide pins 112 disposed around the periphery of the WUT and the test substrate ensure accurate alignment. (The interconnection substrate can have a larger diameter than the WUT, and the guide pins can pass through corresponding guide holes in the interconnection substrate.) A compression stop (block ring) 114, which suitably is disposed on the face of the WUT, limits the amount of travel—i.e., the distance that the tips of the spring contact elements 110 will deflect when urged against the capture pads 120.

As illustrated in FIG. 1A, a host controller 116 provides signals to the ASICs 106 via the interconnection substrate 108. These signals are test signals for exercising the plurality of DUTs. Since the DUTs on the WUT are typically identical to one another, a single set of test signals (vectors) may be generated for the plurality of DUTs. Alternatively, the test vectors are generated by the individual ASICs, under the overall control of the host computer. Power (e.g., Vdd and Vss) are also suitably supplied to the DUTs from a power supply 118, via the ASICs 106 (e.g., feeding directly through the ASICs).

The interconnection substrate 108 is essentially a wiring (interconnection) substrate, and is preferably a silicon wafer having the same coefficient of thermal expansion as the WUT 102. The ASICs 106 are suitably connected to the interconnection substrate by bond wires extending between the front (bottom, as viewed) surfaces of the ASICs to the front (bottom, as viewed) surface of the support substrate.

A key feature of the invention is that there is a direct connection (via spring contact elements 110) between the DUTs and the ASICs. This is where the vast majority of the connections in the overall system are made and, as described in greater detail hereinbelow, very (extremely) few connections need to be made within the interconnection substrate (108) itself. The direct connection between the ASICs and the DUTs is facilitated by disposing the ASICs on the DUT-side (front surface) of the interconnection substrate. For example, if tens of thousands (e.g., 30,000) of connections to the DUTs were being made via the interconnection substrate (i.e., by spring contact elements of some type disposed on the interconnection substrate rather than via the ASICs), irrespective of where the ASICs were disposed, these tens of thousands of connections would have to be routed within the interconnection substrate. As will be described in greater detail hereinbelow, these tens of thousands of signals can be generated directly by the ASICs themselves to the DUTs with extremely few (e.g., FOUR) signals being routed through the interconnection substrate from the host controller to the ASICs.

The WUT 102 and test substrate 106/108 are suitably disposed within an airtight vessel 130 in communications with a vacuum source (not shown) so that the techniques of the present invention can be carried out in at least a partial vacuum, including in a high vacuum, or in other controlled atmospheric conditions. As mentioned hereinabove, a vacuum advantageously thermally isolates the DUTs from the ASICs.

According to a feature of the invention, the test substrate 106/108 is mounted to a temperature-controlled chuck 104a (compare 104) so that it can be maintained at a temperature which is entirely independent of (typically significantly lower than) the temperature of the WUT 102 during burn-in.

Fanning Out the Tips of the Spring Contact Elements

As mentioned hereinabove, modern semiconductor devices often have a large plurality of bond pads disposed at a fine pitch of approximately 4 mils. The spring contact elements (110) are mounted by their bases to the bond pads of the DUTs. Were the spring contact elements to protrude uniformly (e.g., parallel to one another) from the DUTs, their tips would also be at a 4 mil pitch, and alignment of corresponding capture pads on the ASICs would be difficult.

Figure 1B:
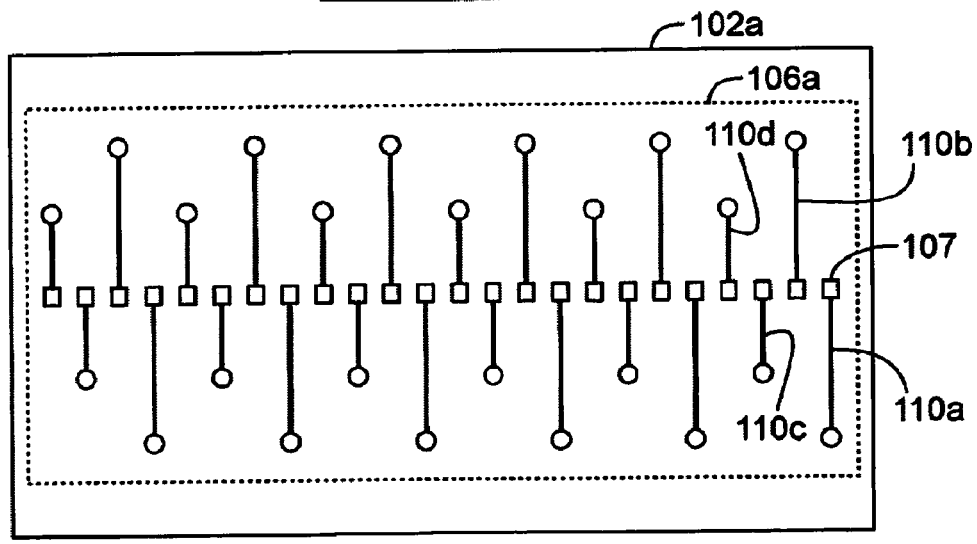
FIG. 1B is a plan view of a small test substrate such as an ASIC (shown in dashed lines) overlying a DUT (shown in solid lines), according to the invention.

As shown in FIG. 1B, each DUT, for example the DUT 102a, has a plurality (twenty four of many shown) of bond pads 107 (shown as squares) arranged along a centerline of the DUT. A free-standing spring contact element (110) is mounted to each bond pad, and is arranged generally at ninety degrees to the centerline of the DUT. As shown in FIG. 1B, the spring contact elements can be arranged so that they extend in opposite directions from one another, as well as being of alternating length. For example, a first spring contact element 110a is relatively long and extends a first distance in a first direction from the centerline of the DUT 102a; a second spring contact element 110b is relatively long and extends the first distance in a second direction opposite the first direction from the centerline of the DUT 102a; a third spring contact element 110c is relatively short and extends a second distance smaller than the first distance in the first direction from the centerline of the DUT 102a; and a fourth spring contact element 110d is relatively short and extends the second distance in the second direction from the centerline of the DUT 102a.

As best viewed in FIG. 1B, the tips (shown as circles) of the spring contact elements 110 are all disposed in an area smaller than the area (within the periphery) of the DUT 102a, the smaller area being the area of the corresponding ASIC 106a, the periphery of which is represented by a dashed-line rectangle in the drawing. In this manner, the free ends (tips) of the spring contact elements 110 are readily caused to be at a greater pitch (spacing) than the bond pads (107) of the DUTs to which they are mounted.

It is within the scope of this invention that the tips of the spring contact elements are constrained in a much smaller space than is shown by the dashed-line rectangle in FIG. 1B, for example, to accommodate smaller DUTs.

Figure 1C:
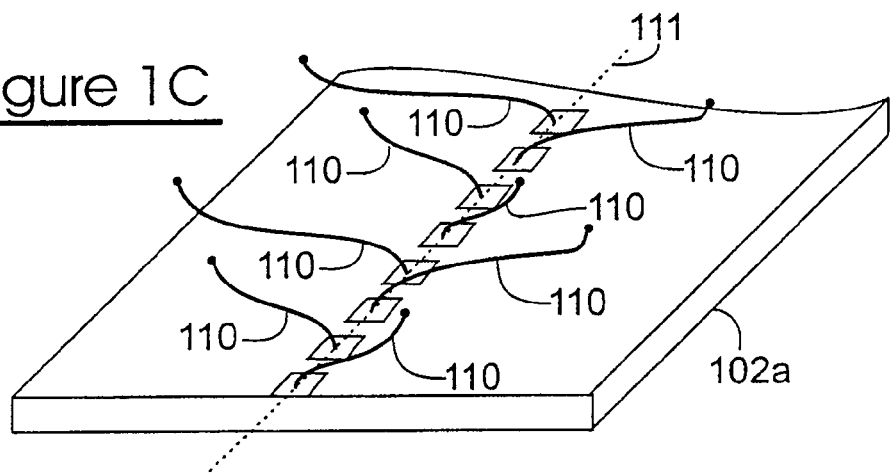
FIG. 1C is a schematic perspective view of the DUT of FIG. 1B, according to the invention.

FIG. 1C is a schematic perspective view of the DUT 102a of FIG. 1B, with the bases tips of the spring contact elements 110 arranged along a centerline of the DUT.

Figure 1D:
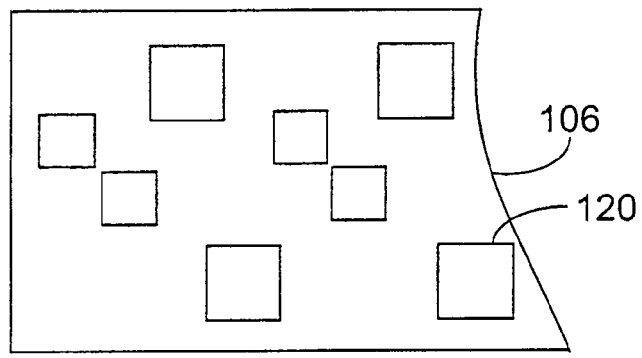
FIG. 1D is a plan view of the front surface of the ASIC of FIG. 1B, according to the invention.

An advantage of this invention, as illustrated in FIG. 1D, is that the "capture" (bond) pads 120 on the ASICs 106 can be oversized (larger than the size of the bond pads 107 on the DUT), thereby relaxing tolerance constraints on the positioning of the tips of the spring contact elements (110).

The PARENT CASE describes a number of ways in which resilient interconnection elements can be mounted to semiconductor devices, while effecting pitch spreading between the bases of the interconnection elements and their tips.

Figure 1E:
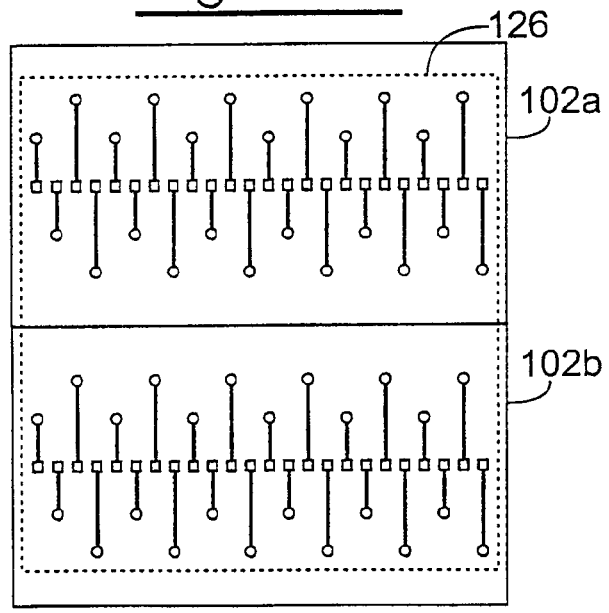
FIG. 1E is a plan view of a small test substrate, such as an ASIC (shown in dashed lines) overlying two DUTs (shown in solid lines), according to the invention.

The interface between the test substrate and the WUT has been illustrated as having one ASIC per DUT, each one of the ASICs being aligned with a corresponding one of the DUTs. It is within the scope of this invention that other relationships can be established. For example, as illustrated in FIG. 1E, a one ASIC 126 (the periphery of which is illustrated by a dashed-line rectangle) can "span" two adjacent DUTs 102a and 102b.

A key feature of the present invention is that the ASICs (106), which are disposed in as close proximity as possible to the DUTs (102), namely on the DUT side of the interconnection substrate (108) are readily provided with built-in functionality. This accomplishes many favorable results. Significantly fewer signals need to be provided from the host computer 116 to the interconnection substrate 108 and fewer signals need to be routed by the interconnection substrate. This relaxation of the signal-carrying constraints on the interconnection substrate allows for much more flexibility in the material, design and realization of the interconnection substrate, and consequent reduction in cost. The close proximity of the ASICs to the DUTs, and corresponding direct connections effected therebetween, also avoids unfavorably long signal paths and facilitates at-speed testing of the DUTs.

As mentioned hereinabove, any suitable spring contact elements can be employed to effect the pressure connections between the ASICs and the DUTs.

Figure 2:
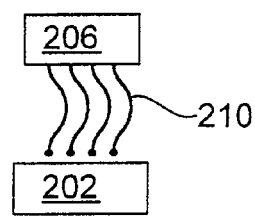
FIG. 2 is a side view of an alternate embodiment for making contact between an ASIC and a DUT, according to the invention.

It is also within the scope of this invention that the spring contact elements be mounted to the ASICs rather than the DUTs. This is illustrated in FIG. 2 wherein a plurality (four of many shown) of spring contact elements 210 (compare 110) are mounted by their bases to the ASICs 206 (compare 106), the tips (distal ends) of the spring contact elements 210 being positioned to make pressure connections to corresponding bond pads (not shown) on the DUTs 202 (compare 102). In other words, any suitable means for effecting connections between the ASICs and the DUTs may be employed to practice the techniques of the present invention. It is also within the scope of this invention that other than spring contact elements be employed to effect the connections between the ASICs and the DUTs including, but not limited to microbumps and the like.

Capturing the Tips of the Spring Contact Elements

As discussed hereinabove, the tips of the spring contact elements mounted to the DUTs can simply be "captured" by pressing against corresponding capture pads on the ASICs, and it has been shown that the tolerance constraints can be relaxed by effecting pitch-spreading with the spring contact elements and by having oversize capture pads on the ASICs. Another technique of effecting a connection between the tips of the spring contact elements and the ASICs is now discussed.

Figure 3A:
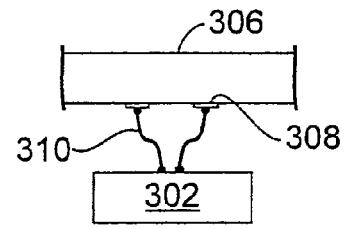
FIG. 3A is a side cross-sectional view of a single one of a plurality of ASICs having capture features which are bond pads, as shown in FIG. 1D, for capturing (being contacted by) the tips of spring contact elements mounted to a DUT, according to the invention.

FIG. 3A illustrates a basic embodiment of capturing the tips of the spring contact elements 310 (compare 110) mounted to a DUT 302 (compare 102) with capture pads which are bond pads 308 (compare 120) disposed on the front surface of the ASIc 306 (compare 106).

According to an aspect of the invention, topological "capture" features can be formed in or on the front surface of the ASIC to ensure reliable alignment of the tips of the spring contact elements with the ASICs during burn-in and test.

Figure 3B:
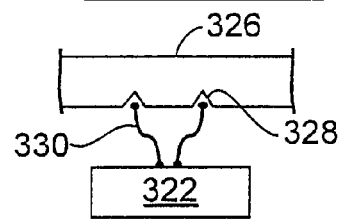
FIG. 3B is a side cross-sectional view of an alternate embodiment of a single one of a plurality of ASICs having features for capturing the tips of spring contact elements mounted to a DUT, according to the invention.

FIG. 3B illustrates a one 326 of the plurality of ASICs (compare 106) mounted to the interconnection substrate (not shown, see 108), a one of the plurality of DUTs 322 (compare 102a), and a technique for effecting a reliable pressure connection between the two. As in previous examples, a plurality of spring contact elements 330 (compare 110) are mounted by their bases to, and extend from, the face of the DUT 322. In this example, the spring contact elements are arranged so that their tips (distal ends) are at a greater (coarser) pitch than their bases.

A plurality (two of many shown) of indentations 328, suitably in the form of pyramids having at least three sides, extend into the ASIC 326 from the face thereof. These indentations 328 as well as other indentations described hereinbelow are readily formed using conventional semiconductor fabricating techniques, such as micromachining.

Metallization (not shown) is applied to the sidewalls of these indentations 328, and is in electrical communication with active elements (not shown) of the ASIC 326.

In use, as the ASIC 326 and the DUT 322 are brought together, the tips of the spring contact elements 330 enter the indentations 328, after which the ASIC can be moved laterally (across the page, as shown) or rotated slightly (around an axis which is vertical on the page) to ensure that the tips of the spring contact elements 330 engage the sidewalls of the indentations 328 with sufficient force to ensure a reliable electrical pressure connection therebetween.

Figure 3C:
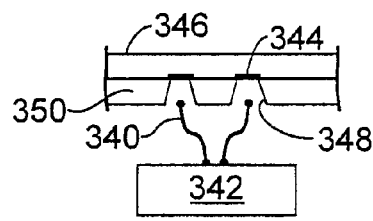
FIG. 3C is a side cross-sectional view of an ASIC, showing an alternate embodiment of features for capturing the tips of spring contact elements mounted to a DUT, according to the invention.

An alternative technique for capturing (engaging) the tips of the spring contact elements is shown in FIG. 3C. In this case, the ASIC 346 (compare 326) has a plurality (two of many shown) of pads (terminals) 344 formed in a conventional manner on its front surface. A layer 350 of insulating material, such a silicon die which has been micromachined to have a plurality (two of many shown) of capture features 348 (compare 328) extending therethrough and aligned with the contact pads 344 is disposed over the front surface of the ASIC 346. In other words, in this alternative technique, rather than forming indentations (328) directly in the surface of the ASIC (346), a distinct overlying structure 350 provides comparable capture features (348). As in the previous example, the sidewalls of the capture features 348 can be metallized, and the ASIC moved either laterally or rotationally with respect to the DUT (342) to ensure a reliable electrical pressure connection between the ASIC 346 and the spring contact elements 340 (compare 330). The silicon die 350 can be nitride-insulated.

It should be appreciated that the means on the ASIC for being contacted by the tips of the spring contact elements must be rugged. To this end, for example, the capture pads (120 or 308 or 344) can be covered (e.g., plated) with 0.5-1.0 mils of a wear-resistant electrically-conductive material such as nickel. In a similar manner, the indentations (capture features) 328 can be covered with a comparable amount of nickel.

Aligning Small Substrates to the Interconnection Substrate

As discussed hereinabove, it is preferred that a plurality of electronic components such as ASICs are mounted to a larger interconnection substrate. Inter alia, this avoids a requirement to yield good active devices over the entire surface of the interconnection substrate. (i.e., in the case of a silicon wafer interconnection substrate, the circuitry of the ASICs could be incorporated directly on the silicon wafer.) Evidently, an appropriate mechanism must be provided to ensure accurate alignment of the plurality of ASICs to the interconnection substrate.

Figure 4:
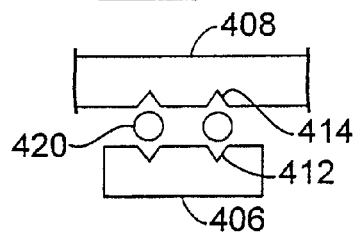
FIG. 4 is a side cross-sectional view of one of a plurality of ASICs having features on its back surface for ensuring accurate alignment to a interconnection substrate, according to the invention.

FIG. 4 illustrates a technique for ensuring accurate alignment of a plurality (one of many shown) of ASICs 406 (compare 106, 206, 306, 326 and 346) to a larger interconnection substrate 408 (compare 108). In this case, the back (top, as viewed) surface of each ASIC 406 is provided with at least two (only two shown) indentations 412 in a manner similar to the indentations 328 and 348 described hereinabove, which are suitably in the form of a pyramid extending into the back surface of the ASIC 106. These indentations 412 may lithographically be defined and formed to tight tolerances, using conventional semiconductor fabricating techniques.

Comparable indentations 414 are formed in the front (bottom, as shown) surface of the interconnection substrate 408 which, as mentioned hereinabove, is suitably a semiconductor wafer. These indentations 414 may likewise be formed using conventional semiconductor fabricating techniques to as to have tight tolerances (compare 306).

The indentations 412 and 414 each have a dimension ("breadth") as measured across the surface of the respective ASIC 406 or interconnection substrate 408 in which they are formed. The breadth of the ASIC indentations 412 is preferably the same as the breadth of the interconnection substrate indentations 414, both of which are suitably in the range of 3-5 mils, such as 4 mils.

To assemble the ASIC 406 to the interconnection substrate 408, small spheres (balls) 420 having a diameter comparable to the breadth of the indentations 412 and 414 are disposed between the indentations 412 and the corresponding indentations 414 to ensure accurate alignment of the ASIC 406 on the front surface of the interconnection substrate 408. The diameter of the balls 4200 is preferably slightly, such as 2±1 mils, larger than the breadth (width) of the indentations 412 and 414, which will result in there being a small gap of controlled dimension between the back (top, as viewed) surface of the ASIC 406 and the front (bottom, as viewed) surface of the interconnection substrate 408. For example, the dimension of the gap (vertical, as viewed) is in the range of 2-5 mils.

A suitable adhesive (not shown), preferably thermally-conductive, is disposed in the gap (i.e., between the opposing faces of the ASIC and the interconnection substrate) to secure the ASIC to the interconnection substrate. An example of a suitable adhesive is silver-filled epoxy, and the adhesive should preferably be of a type that permits a defective ASIC to be removed (such as with a suitable solvent, or with heat) and replaced.

It is within the scope of this invention that any suitable mechanism for aligning the ASICs to the interconnection substrate be employed. For example, attention is directed to the alignment techniques for aligning small substrates (e.g., 620) with larger substrates (e.g., 622) described in the aforementioned commonly-owned PCT/US96/08117. For example, it is within the scope of this invention that the back of the ASIC is provided with a sizeable (such as rectangular, 10 mils by 20 mils) solder feature, that the front of the interconnection substrate is provided with a comparable sizeable solder feature, and that a solder (or gold-tin) preform is disposed therebetween and reflowed, whereupon surface tension exerted by the solder in its liquid state will ensure accurate alignment of the ASIC to the interconnection substrate.

Connecting the ASICs to the Interconnection Substrate

As mentioned hereinabove, the ASICS are suitably electrically connected to the interconnection substrate using conventional wire-bonding techniques.

For powering up a plurality of DUTs resident on a WUT, for the purpose of burning in the DUTs, a relatively large amount of electrical power is required. For example, on the order of hundreds of watts for an entire WUT. Due to the physical layout of the system of the present invention, it is preferred to deliver this electrical power through the ASICs, and through the corresponding spring contact elements. In the description that follows, a technique is illustrated for feeding power "straight through" the ASICs.

Figure 5:
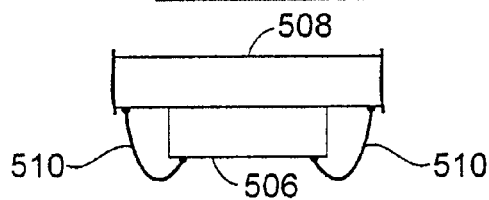
FIG. 5 is a side view of a technique for making electrical connections between ASICs and the interconnection substrate, according to the invention.

FIG. 5 illustrates an ASIC 506 (compare 106, 206, 306, 326, 346 and 406) which ordinarily would be electrically connected with bond wires (510) to a interconnection substrate 508 (compare 108). In contrast to relatively few connections being required to initiate the ASIC providing signals to the DUT (not shown), in order to power up the DUTs to effect burn-in a substantial amount of power is required, requiring a corresponding substantial number of bond wire connections between the ASIC and the interconnection substrate. The number of bond wire connections between the ASIC and the interconnection substrate would approximately be equal to the number of power connections being made (e.g., via spring contact elements 110) to the DUT (e.g., 102), which could be one hundred or more.

According to an aspect of the invention, power is conveyed between the interconnection substrate and the ASIC using interconnection means which are capable of carrying more power (watts) than conventional bond wires, thereby reducing the number of connections required.

Figure 5A:
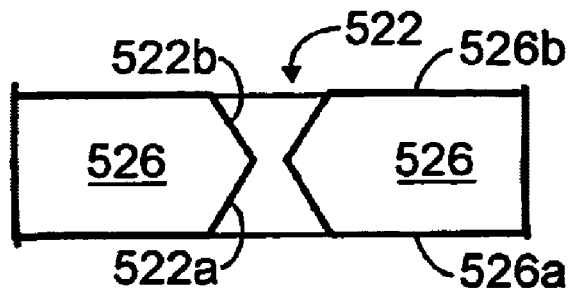
FIGS. 5A, 5B, and 5C are side cross-sectional views of a technique for providing electrical paths from the front surface of an electronic component such as the ASIC of the present invention to the back surface of the ASIC, according to the invention.
Figure 5B:
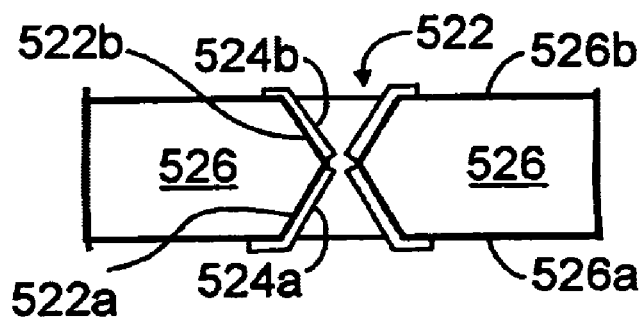
Figure 5C:
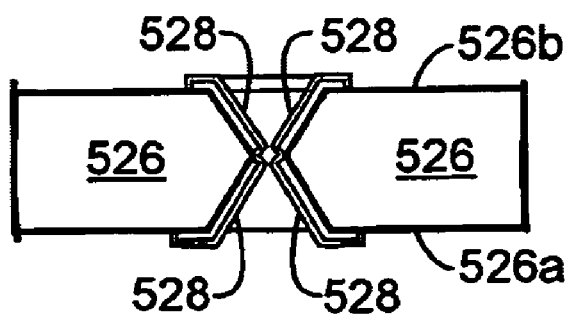

FIGS. 5A, 5B and 5C illustrate a technique for effecting electrical connections between an ASIC and a interconnection substrate.

FIG. 5A illustrates an ASIC 526 (compare 106, 206, 306, 326, 406 and 506) having a small plurality (one shown) of holes 522 extending completely through the body of the ASIC 526 from its front surface 526a to its back surface 526b. These holes 522 are suitably formed in a manner similar to that which was employed to create the indentations 308 in the front surface of the ASIC 306 and the indentations 412 in the back surface of the ASIC 406— namely, a indentation (first portion of the hole 522) 522a is formed in the front surface 526a of the ASIC 526 to a depth of at least half the thickness (vertical, as viewed) of the ASIC 526, and a indentation (second portion of the hole 522) 522b is formed in the back surface 526b of the ASIC 526 to a depth sufficient that the second hole portion 522b is contiguous with the first hole portion 522a. The dimensions of the hole portions 522a and 522b are such as to ensure that there is a continuous opening extending through the ASIC die 526.

FIG. 5B illustrates a next step in the process, wherein a conductive layer (e.g., tungsten, titanium-tungsten, etc.) is deposited, such as by sputtering into the first and second hole portions 522a, 522b, resulting in a first conductive layer portion 524a extending into the first hole portion 522a and a second conductive layer portion 524b extending into the second hole portion 522b. As illustrated, there is a discontinuity between these two conductive layer portions 524a and 524b. As illustrated, the conductive layer portions 524a and 524b preferably extend from within the respective hole portions onto the respective surfaces 526a and 526b of the ASIC 526. In practice, a one side (left or right, as viewed) of each hole portion 522a and 522b may receive more material from sputtering than an opposite (right or left, as viewed) side of the hole portion.

FIG. 5C illustrates a next step in the process, wherein the discontinuity between the two conductive layer portions 524a and 524b is connected (bridged) by a mass 528 of conductive material (e.g., gold, nickel, etc.), which is suitably applied by plating (i.e., immersing the ASIC in a plating bath and plating sufficient to connect the two conductive layer portions).

The process described for forming conductive vias in the ASIC are equally applicable to the interconnection substrate of the present invention.

It is within the scope of this invention that a dollop of conductive material (e.g., silver-filled epoxy) is disposed within the hole portions to bridge the discontinuity (i.e., rather than plating to bridge the discontinuity).

Spring Contact Elements

Free-standing elongate spring contact elements, such as have been shown in FIG. 1 (elements 110) and FIG. 2 (elements 210), and methods of mounting such spring contact elements to substrates including semiconductor devices are described in detail in many of the aforementioned U.S. and PCT patent applications, for example in U.S. patent application Ser. No. 08/452,255 and its counterpart PCT Patent Application No. US95/14909. Such spring contact elements as described therein are also referred to as "composite interconnection elements", "resilient contact structures", and the like, and generally involve wirebonding a soft (e.g., gold) wire to a terminal of an electronic component, shaping and severing the wire into a wire stem having a springable shape, and overcoating the wire stem and adjacent area of the terminal with at least one layer of a hard material (e.g., nickel). Such composite interconnection elements can also be fabricated upon sacrificial substrates and subsequently mounted to the electronic component.

It is within the scope of this invention that any suitable spring contact elements be employed to realize the wafer-level burn-in and test system of the present invention.

Figure 6A:
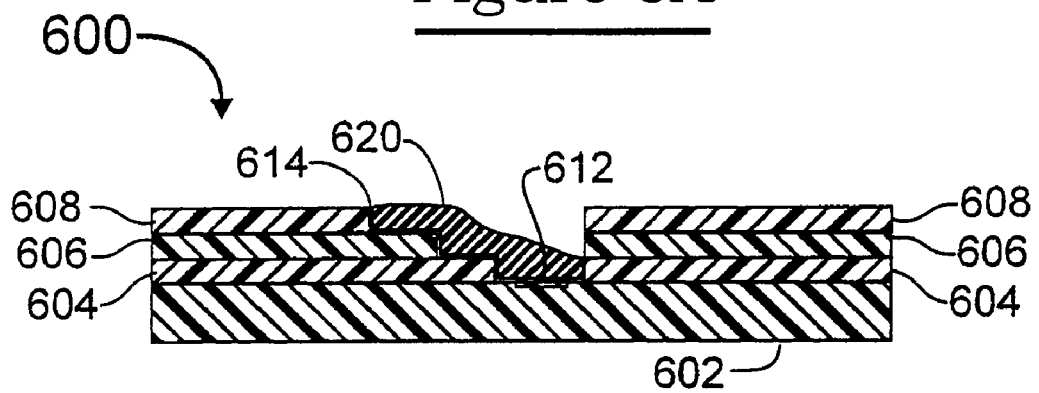
FIGS. 6A and 6B are side cross-sectional views of a technique for mounting spring contact elements to a DUT, according to the invention.
Figure 6B:
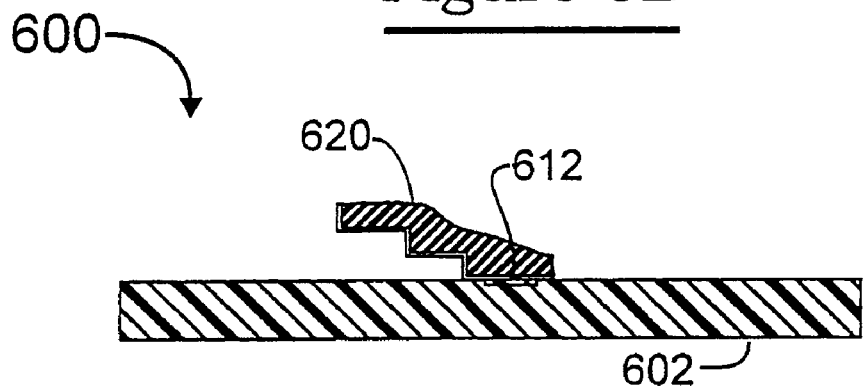
Figure 6C:
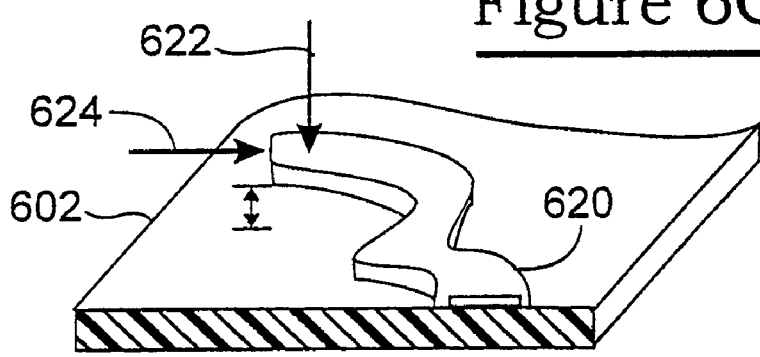
FIG. 6C is a perspective view of the spring contact element of FIG. 6B, according to the invention.

FIGS. 6A-6C illustrate an alternative technique for forming spring contact elements which can be employed in the present invention. These spring contact elements are "fabricated" rather than "composite".

As illustrated in FIG. 6A, an example of a technique 600 for fabricating resilient free-standing contact structures involves applying a number (three shown) of patterned insulating layers 604, 606, 608 atop a semiconductor device 602. The semiconductor device 602 has a plurality (one shown) of bond pads 612 on its surface (or accessible from its surface). The layers are patterned to have openings (as shown) aligned with the bond pad(s), and the openings are sized and shaped so that an opening in a one layer (e.g., 608, 606) extends further from the bond pad than an opening in an underlying layer (e.g., 606, 604, respectively). A layer of conductive material 614 is applied into the opening. Next, a mass of conductive material 620 can be formed in the opening(s), such as by electroplating. As illustrated, this mass will be anchored to the bond pad 412 and, after the insulating layers are removed (as best viewed in FIGS. 6B) will be free-standing (attached at only one end thereof). By suitable choice of material and geometry, these masses 620 can function as resilient free-standing contact structures. As best viewed in FIG. 4C, the fabricated contact structures 620 of FIGS. 6A and 6B extend not only vertically above the surface of the component 602, but also laterally. In this manner, the contact structures 620 are readily engineered to be compliant in both the Z-axis (as illustrated by the arrow 622) as well as in the x-y plane (parallel to the surface of the component 602, as illustrated by the arrow 624).

Burning-In the DUTs

The process of burning-in a semiconductor device involves powering up the devices at an elevated temperature to accelerate the failure of latent defective dice (i.e., to advertently cause "infant mortality"). It is known that this acceleration can be enhanced by elevating the temperature and the applied operating voltage. However, if the semiconductor devices are already packaged, the materials of the package (e.g., plastic) impose limitations (a barrier) upon the temperatures to which the packaged semiconductor devices can be exposed in a burn-in furnace. Very few packages can tolerate prolonged exposure to high temperatures, especially when organic materials are included in the packaging.

A common burn-in regime involves heating the packaged semiconductor device to a temperature of 125° C. for a period of 96 hours. Generally, burn-in time can be halved for every 10 degrees Celsius rise in junction temperature. For example, if DUTs require one day at 150° C. to be burned-in, they can effectively be burned-in in one-half day at 160° C.

Another barrier to elevating burn-in temperature is that any testing device, resident in the burn-in furnace will also be heated up, which may accelerate its failure. For example, the ASICs of the present invention would experience accelerated failures if exposed to the same burn-in temperatures as the DUTs.

According to an aspect of the invention, burn-in is performed at a temperature of at least 150° C. Since the DUTs are not yet packaged, and since the spring contact elements mounted to the DUTs (or to the ASICs) are entirely metallic, at this stage of the process, it is possible to subject the DUTs to temperatures that would otherwise be destructive of packaged semiconductor devices which include materials which cannot sustain such elevated temperatures. Burn-in can be performed upon all of the wafer-resident (un-singulated) semiconductor devices (DUTs), or upon selected portions of the wafer-resident semiconductor devices.

As mentioned hereinabove, the ASICs (106) and the WUT (102) are readily disposed in a vessel which can be evacuated to create a substantial vacuum, and the WUT (102) is readily mounted on a temperature-controlled chuck (104). Since the electrical power required to initiate burn-in generates heat, in most instances more than sufficient heat to elevate the DUTs to the desired burn-in temperature, the temperature controlled chuck (104) operates in a cooling mode. Since there is a vacuum, there is a minimal thermal path between the DUTs and the ASICs, other than the spring contact elements (110), thereby allowing the ASICs to operate at substantially lower temperatures than the burn-in temperature of the DUTs.

Reduced Connectivity Required, and Other Advantages

Figure 7:
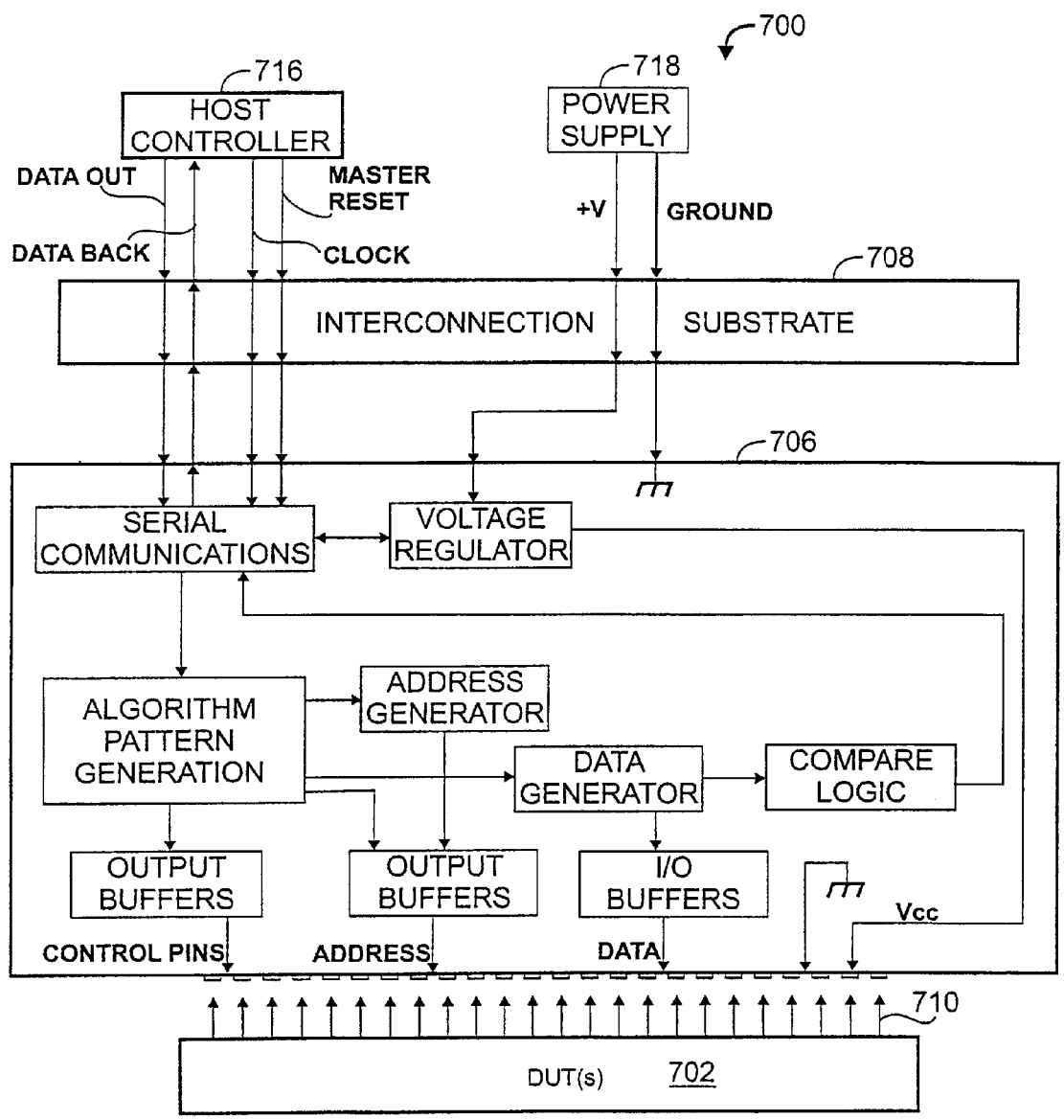
FIG. 7 is a schematic of the system of the present invention (compare FIG. 1A), illustrating connectivity and overall functionality, for a specific instantiation of the invention, according to the invention.

FIG. 7 illustrates an instantiation of the system 700 (compare 100) of the present invention, illustrating a number of features which would be applicable to a variety of instantiations of the technique of the present invention. These features are a plurality of ASICs 706 (compare 106) are mounted to a interconnection (support) substrate 708 (compare 108), and a plurality of DUTs 702 (compare 102) have spring contact elements 710 (compare 110) mounted to their front surfaces for making contact to the front surfaces of the ASICs. A power supply 718 (compare 118) provides power, via the interconnection substrate 708, via the ASIC 706 and via the means 710 for interconnecting the ASICs and the DUTs, to the DUTs 702 to power them up for burn-in.

A host controller 716 (compare 116) provides signals to the ASICs 706 via the interconnection substrate 708. Very few signals need to be provided to each ASIC 706, for example a serial stream of data, to individually control the plurality (one of many shown) of ASICs 706 mounted to the interconnection substrate 708.

The instantiation illustrated in FIG. 7 is an example of a system for testing DUTs which are memory devices. The host controller 716 is connected to the plurality of ASICs 708 through a data bus which needs very few (e.g., four) lines: a line for data out (labeled DATA OUT), a line for data back (labeled DATA BACK), a line for resetting the ASICs (labeled MASTER RESET), and a line conveying a clock signal (labeled CLOCK). All of the ASICs mounted to the interconnection substrate are connected to these FOUR "common" lines which are connected in the interconnection substrate to all of the ASICs. This illustrates the simplicity in realizing (i.e., manufacturing) an interconnection substrate (708) which is adapted in use to test a plurality of complicated electronic components (DUTs).

Power (labeled +V) and ground (labeled GROUND) connections are similarly easily dealt with in the interconnection substrate. Essentially, only two lines are required in the interconnection substrate, which are preferably realized as planes (i.e., a power plane and a ground plane) in a multilayer interconnection substrate.

A problem associated with prior art techniques of powering up a plurality of DUTs is voltage drop through the interconnection substrate. This problem is overcome by the present invention by providing increased voltage to the ASICs (706) and incorporating a voltage regulator (labeled VOLTAGE REGULATOR) in the ASICs.

One having ordinary skill in the art to which the present invention most nearly pertains will recognize that additional functionality, not specifically illustrated, may readily be incorporated into the ASICs. For example, providing each ASIC with a unique address and an address decoding function, to individualize its response to a serial stream of data coming from the controller 716.

As noted hereinabove, the interconnection substrate requires very few distinct lines, or nodes. Yet, each ASIC can readily communicate over a large number of interconnection elements (spring contact elements) directly with the DUT to which it is directly connected. And the many ASICs resident on the interconnection substrate can communicate multiples of the large number of connections between the ASICs and the DUTs. This is a non-trivial advantage over prior art techniques. For example, if one were to instantiate the system of the Matsushita Patent, in an application requiring the testing of a number (e.g., five hundred) of non-trivial DUTs (e.g., 16 Mb DRAMs), the interconnection substrate (4) would be very complex (e.g., providing 30,000 connections between each pin of the testing circuit chips (2) and each of the corresponding 30,000 contact elements between the interconnection substrate (4) and the DUTs (1)) and would consequently be very difficult to fabricate and to yield.

A profound advantage of the present invention is that the overall "connection count" can substantially be decreased, most notably in the interconnection substrate. A mentioned hereinabove, an 8" wafer may contain 500 16 Mb DRAMs, each having 60 bond pads, for a total of 30,000 connections. Using the technique of the present invention, these 30,000 connections are directly made between the ASICs and the DUTs. From the ASICs, through the interconnection (support substrate), back to the host controller. For example, power (2 lines) and a serial signal path (as few as two lines, including the ground line from the power source). This is in marked contrast to techniques of any prior art which, even if it were to use the ASICs of the present invention or similar instrumentality, would require connecting the ASICs via an interconnection substrate to means interconnecting the interconnection substrate to the DUTs. The present invention completely eliminates this problem, and substantially reduces the numbers of nodes required on the interconnection substrate, by effecting connections directly between the ASICs and the DUTs.

Another advantage of the present invention is that the ASICs are on the WUT-side of the support substrate, thereby minimizing the signal path between the ASICs and the DUTs and facilitating at-speed testing of the DUTs. Were the arrangement otherwise, for example ASICs mounted to the opposite (from the WUT) side of the support (wiring) substrate, signal delays and undesired parasitics would be present, thereby causing additional design challenges to implement a realizable system.

A technique has thus been described that provides the following back-end flow: fabricate interconnection elements (e.g., spring contact elements) on the unsingulated semiconductor devices; Wafer-Level Burn-in & Test (with higher temperature burn-in being facilitated); (optional) Encapsulation; Wafer-Level Speed Sort; Wafer Saw & Singulation; Ship product.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein. Several of these variations are set forth in the PARENT CASE.

For example, it is within the scope of this invention that testing can also be performed during burn-in, and with active semiconductor devices such as ASICs resident on the test substrate, certain test sequences can be controlled with relatively few signals to the ASIC and certain results can be obtained and actions initiated in response thereto by the ASIC.

For example, rather than mounting a plurality of ASICs to a single support (interconnection) substrate, the interconnection substrate may be a silicon wafer, and the ASICs can be formed directly in the wafer, using conventional semiconductor fabricating techniques. In such a case, it would be advantageous to provide redundant test elements in the wafer, test the wafer, and ensure that elements which are determined to be functional are turned on (and those which are determined not to be functional are turned off).

What is claimed is:

1. Method of performing burn-in on semiconductor devices, comprising:
    electrically connecting first terminals of a test substrate to second terminals of at least one semiconductor device (DUT) by compressing a plurality of electrically conductive spring contact elements between the first terminals and the second terminals, wherein each of the conductive spring contact elements directly connects one of the first terminals to one of the second terminals;
    powering up the at least one DUT;
    maintaining the at least one DUT at a first temperature; and
    maintaining the test substrate at a second temperature which is independent of the first temperature.

2. Method, according to claim 1, wherein:
    the second temperature is lower than the first temperature.

3. Method, according to claim 1, wherein:
    the second temperature is no greater than the first temperature.

4. Method, according to claim 1, further comprising:
    disposing the test substrate and the at least one DUT in a vacuum environment, said vacuum providing a thermal barrier between the at least one DUT and the test substrate.

5. Method, according to claim 1, wherein:
    the at least one DUT is a plurality of semiconductor devices resident on a semiconductor wafer (WUT).

6. Method, according to claim 1,
    wherein the spring contact elements are mounted to the terminals of the test substrate.

7. Method, according to claim 1,
    wherein the spring contact elements are mounted to the terminals of the at least one DUT.

8. Method, according to claim 7, wherein:
    the spring contact elements are elongate, mounted by their bases to the at least one DUT, and have free ends; and further comprising:
    fanning out free ends of the spring contact elements so that they have a coarser pitch at their free ends than at their bases.

* * * * *